(12) United States Patent
Shieh et al.

(10) Patent No.: US 8,803,595 B2
(45) Date of Patent: Aug. 12, 2014

(54) COMMON MODE NOISE CANCELLATION CIRCUIT FOR UNBALANCED SIGNALS

(71) Applicant: C-Media Electronics Inc., Taipei (TW)

(72) Inventors: Wen-Lung Shieh, Taipei (TW); Chih-Ying Huang, Taipei (TW)

(73) Assignee: C-Media Electronics, Inc., Taipei (TW)

( * ) Notice: Subject to any disclaimer, the term of this patent is extended or adjusted under 35 U.S.C. 154(b) by 0 days.

(21) Appl. No.: 13/838,778

(22) Filed: Mar. 15, 2013

(65) Prior Publication Data

US 2014/0139284 A1 May 22, 2014

(30) Foreign Application Priority Data

Nov. 16, 2012 (TW) .............................. 101142843 A (51) Int. Cl.
*H03K 5/00* (2006.01)

(52) U.S. Cl.
USPC .......................................... 327/551; 327/310

(58) Field of Classification Search
USPC ................................................. 327/310, 551
See application file for complete search history.

(56) References Cited

U.S. PATENT DOCUMENTS 8,115,537 B2 * 2/2012 Chung et al. .................. 327/551

* cited by examiner

*Primary Examiner* — Hai L Nguyen
(74) *Attorney, Agent, or Firm* — Rosenberg, Klein & Lee (57) ABSTRACT

This invention provides a common mode noise cancellation circuit for the unbalanced signals. The unbalanced signals come from a signal source with a first signal terminal and a second signal terminal having a first grounding potential. The common mode noise cancellation circuit comprises a grounding terminal and a subtractor. The grounding terminal with a second grounding potential is electrically coupled to the second signal terminal of the signal source through an impedance unit. The subtractor comprises a first receiving terminal, a second receiving terminal and a signal output terminal. The first receiving terminal and the second receiving terminal are electrically coupled to the first signal terminal and the second signal terminal respectively for receiving the unbalanced signals. The subtractor subtracts the noise coming from the first receiving terminal and the noise coming from the second receiving terminal to reduce the output noise of the signal output terminal.

14 Claims, 5 Drawing Sheets

COMMON MODE NOISE CANCELLATION CIRCUIT FOR UNBALANCED SIGNALS

BACKGROUND

1. Technical Field

The present disclosure relates to a common mode noise cancellation circuit, in particular, to the common mode noise cancellation circuit for unbalanced signals.

2. Description of Related Art

Interference caused by common mode noise is a common issue in an electronic system. Such, phenomenon occurs when a positive/negative terminal and grounding of a signal are interfered with the same noise. Interference caused by the common mode noise is likely to have a negative impact on a signal and a system, such as downgrading signal quality and system performance. A conventional solution to common mode noise interference is to utilize fully differential signals, so as to eliminate the noise by subtracting the positive terminal with the negative terminal of the interfered signal. However, if interference caused by the common mode noise occurs in an unbalanced signal system, meaning the signal and the grounding are both interfered simultaneously. In this case, interferences on both terminals are difficult to be removed.

Figure 1:
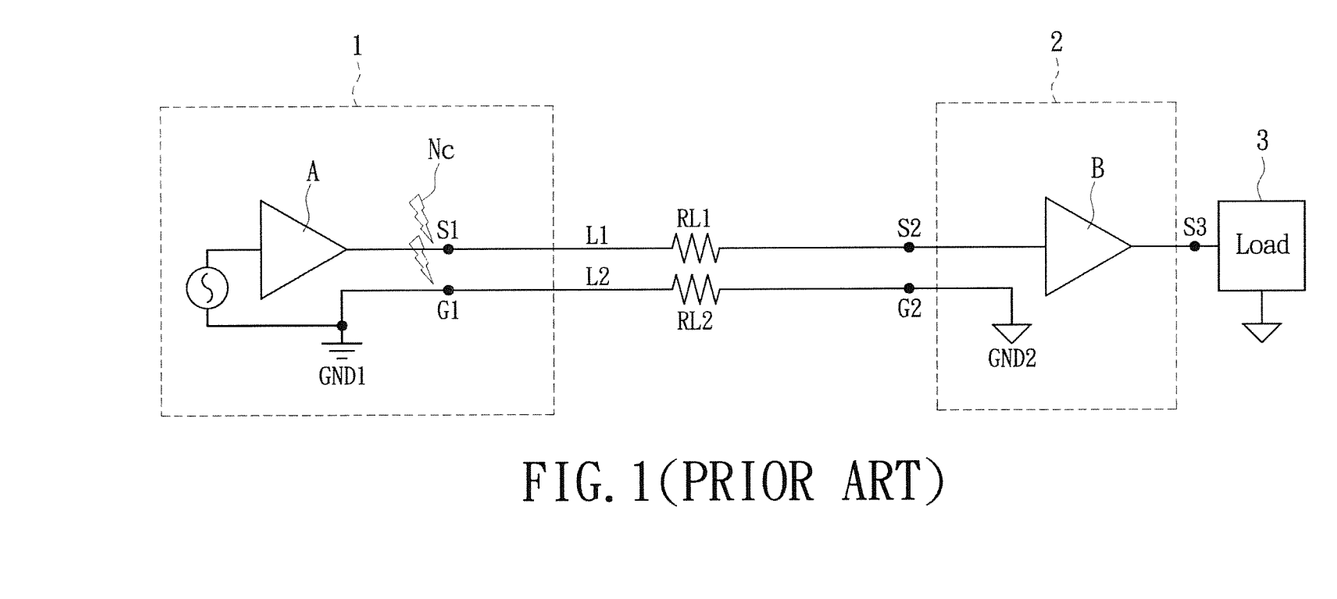
FIG. 1 is a diagram illustrating a conventional example of amplifier system with unbalanced wires connection.

Please refer to FIG. 1. FIG. 1 is a diagram illustrating a conventional example of amplifier system with unbalanced wires connection. A first signal terminal S1 and a second signal terminal G1 of an amplifier A of a signal source 1 represent an output signal and grounding of the amplifier A respectively. Signals of the first signal terminal S1 and the second signal terminal G1 can be interfered by external common mode noise Nc. The signals are transmitted to a receiving circuit 2 via wires L1 and L2. The RL1 and RL2 represent the line resistors of L1 and L2 respectively. The receiving circuit 2 comprises an amplifier B. Assuming potential of a grounding terminal GND2 of the receiving circuit 2 is an ideal grounding potential, hence a signal of a node G2 of the amplifier B is clean and possesses zero potential. Assuming the input impedance of the amplifier B is infinite, the signal at the node S2 will almost be identical to a signal of the first signal terminal S1, and will still carry the common mode noise. After amplification of the amplifier B, common mode noise at node S3 is also amplified on load 3.

Figure 2:
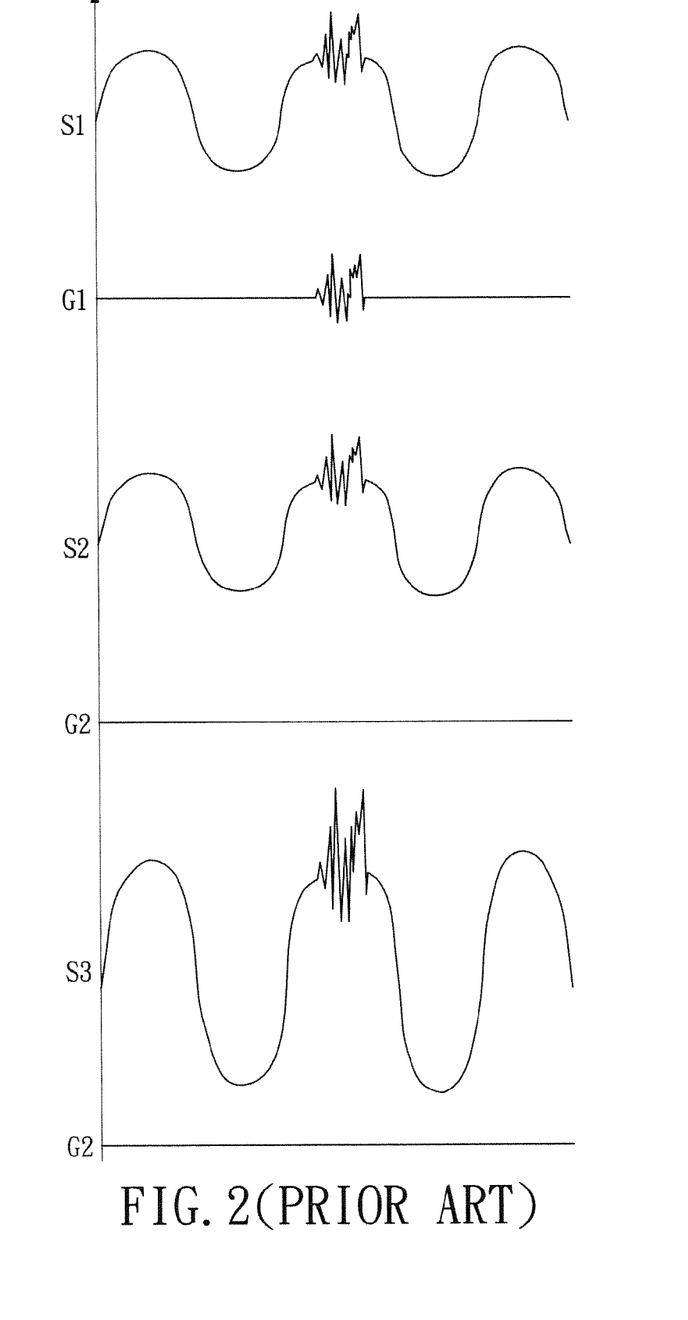
FIG. 2 is a diagram illustrating the noise coupling waveforms derived from the circuits shown in FIG. 1.

Please refer to FIG. 2. FIG. 2 is a diagram illustrating the waveform of amplifier system with unbalanced wires connection shown in FIG. 1. Signals at the first signal terminal S1 and the second signal terminal G1 are a pair of unbalanced signals, which are coupled with the same noise simultaneously, but a differential signals (S1−G1) of the first signal terminal S1 and the second signal terminal G1 can eliminate such common mode noise. Since the signal of the node G2 is clean ground, so when the signal is transmitted to the amplifier B, the resistor RL2 separates signals of the second signal terminal G1 from signals of the node G2 and maintains a certain potential difference, and it can be assumed that grounding to which the second signal terminal G1 is coupled possesses an ideal zero potential. Assuming an input of the amplifier B is very high impedance, noise at the node S2 is not attenuated. Hence it can be observed that an original signal added common mode noise are both amplified and feeds to the load 3 at node S3. The signal to noise ratio (SNR) of such system will get worse.

According to above mentioned issues, if the frequency of the common mode noise is high, a common mode choke can be utilized to eliminate or attenuate the common mode noise. However, if the noise frequency is low, the common mode choke is almost invalid to reduce the noise since impedance of an inductive component such as the common mode choke is very low in low frequency. For example if the common mode noise is within the audio band, it is very difficult to remove the noise with common mode choke.

Further, since common mode noise for unbalanced signals is not an easy issue to be solved, a conventional solution is to convert the unbalanced signal to a balanced or said fully differential signals during signal processing. Such process, however, can be complex and costly. Hence interference caused by common mode noise, especially in low frequency, is a problem which is difficult to be solved. For instance, in GSM (Global System for Mobile Communications), interference in 217 Hz (Hertz) caused by TDD (Time Division Duplex) is a common issue. Since the frequency of such interference is within audio band, voice signal of a mobile phone is directly interfered. A general problem is that when using a wired earphone on GSM mobile phone, TDD noise possibly couples to the earphone via wireless radio radiation or wired power noise coupling from the handset. The TDD noise direct couples to both signal and ground lines of the earphone, it is a kind of common mode noise interference. As a result, it is important for the driving circuitry and the circuit layout between the mobile phone and the earphone to cope/tolerate with the common mode noise interference. Earphone wiring can only utilize metallic shielding to block out as much common mode noise interference caused by radiation as possible, or even utilize a notch filter to eliminate the interference signal of such specific frequency. A device such as the common mode choke is almost invalid to common mode interference since the noise is within the low frequency audio band. Therefore, it is difficult and costly to eliminate the interference caused by common mode noise, especially for low frequency signals.

Another example is a conventional electronic product using commercial power. Such product is also prone to power source interferences (such as common mode noise interference in 60 Hz from a power system) if designed badly or is with poor grounding. Such interference is likely to affect other peripherals connecting to the electronic product. The peripherals can be easily affected unless the peripherals are designed for anti-interference.

SUMMARY

An exemplary embodiment of the present disclosure provides a common mode noise cancellation circuit for the unbalanced signals, so as to eliminate the common mode noise in the unbalanced signal.

An exemplary embodiment of the present disclosure provides common mode noise cancellation circuit for the unbalanced signals. The unbalanced signals come from a first signal terminal and a second signal terminal of a signal source. The second signal terminal has a first grounding potential. The common mode noise cancellation circuit comprises a grounding terminal and a subtractor. The grounding terminal has a second grounding potential. The grounding terminal is electrically coupled to the second signal terminal of the signal source via an impedance unit. The subtractor comprises a first receiving terminal, a second receiving terminal and a signal output terminal. The first receiving terminal and the second receiving terminal are electrically coupled to the first signal terminal and the second signal terminal respectively, for receiving the unbalanced signals. The subtractor subtracts noise coming from the first signal terminal and noise coming from the second signal terminal from each other for reducing noise outputted by the signal output terminal.

To sum up, the common mode noise cancellation circuit of the present disclosure for the unbalanced signals can eliminate the common mode noise from the signal source via signal subtraction, when the unbalanced signals are received or transmitted. The common mode noise cancellation circuit of the embodiments of the present disclosure can eliminate common mode noise with wider bandwidth especially performs better noise reduction in low frequency band.

In order to further understand the techniques, means and effects of the present disclosure, the following detailed descriptions and appended drawings are hereby referred, such that, through which, the purposes, features and aspects of the present disclosure can be thoroughly and concretely appreciated: however, the appended drawings are merely provided for reference and illustration, without any intention to be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

Reference will now be made in detail to the exemplary embodiments of the present disclosure, examples of which are illustrated in the accompanying drawings. Wherever possible, the same reference numbers are used in the drawings and the description to refer to the same or like parts.

[Embodiment of a Common Mode Noise Cancellation Circuit for an Unbalanced Signals]

Figure 3:
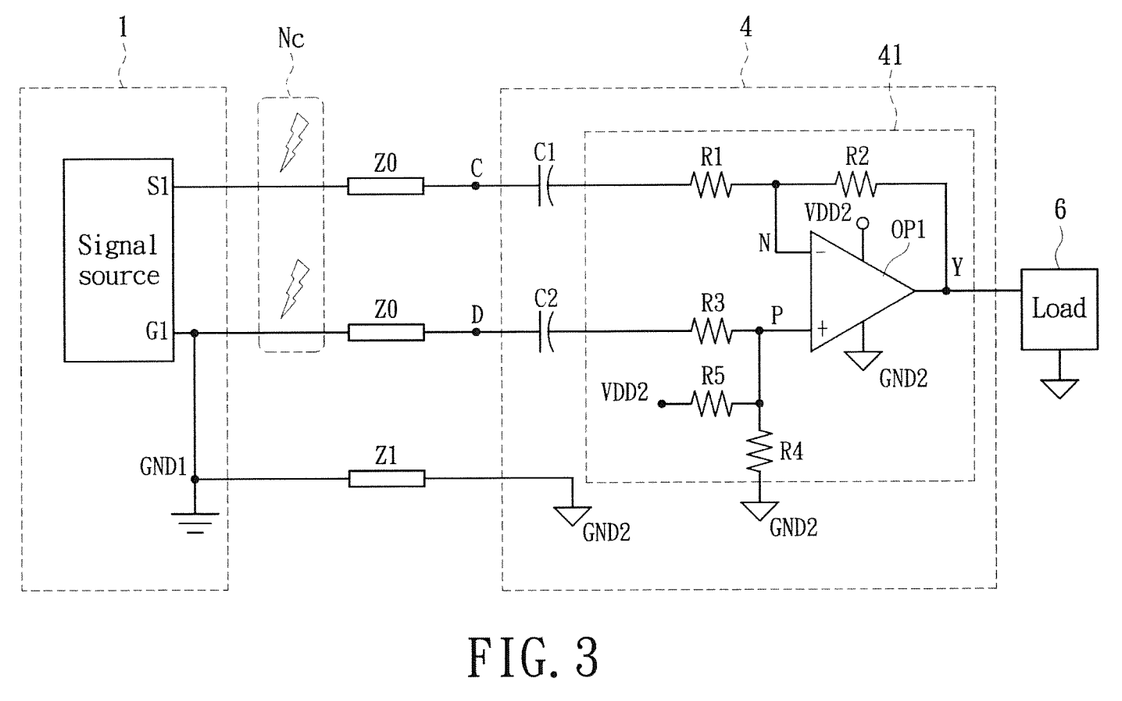
FIG. 3 is a diagram illustrating a common mode noise cancellation circuit for the unbalanced signals according to an embodiment of the present disclosure.

Please refer to FIG. 3. FIG. 3 is a diagram illustrating a common mode noise cancellation circuit 4 for the unbalanced signals according to an embodiment of the present disclosure. The unbalanced signals are from a first signal terminal S1 and a second signal terminal G1 of a signal source 1. The second signal terminal G1 is coupled to a grounding terminal GND1 and possesses a first grounding potential. The unbalanced signals can be any signals that are single-ended and referenced to ground. The common mode noise cancellation circuit 4 comprises the grounding terminal GND1 and a subtractor 41.

The grounding terminal GND2 comprises a second grounding potential. The grounding terminal GND2 is electrically coupled to the second signal terminal G1 of the signal source 1. In the present embodiment, an impedance unit Z1 can be a resistance unit or a reactance unit, etc. The subtractor 41 comprises a first receiving terminal C, a second receiving terminal D and a signal output terminal Y. The first receiving terminal C and the second receiving terminal D are electrically coupled to the first signal terminal S1 and the second signal terminal G1 respectively, for receiving the unbalanced signals. The subtractor 41 subtracts the noise coming from the first receiving terminal C from the noise coming from the second receiving terminal D to reduce, or eliminate, the output noise of the signal output terminal Y. The signal output terminal Y is electrically coupled to a load 6. A capacitor C1 is coupled to the first receiving terminal C. A capacitor C2 is coupled to the second receiving terminal D. The capacitors C1 and C2 are for filtering direct current (DC) signals.

In the present embodiment, the subtractor 41 comprises an operational amplifier OP1, a first resistance unit R1, a second resistance unit R2, a third resistance unit R3 and a fourth resistance unit R4. The operational amplifier OP1 comprises an inverted input terminal N, a non-inverted input terminal P and an output terminal. The output terminal of the operational amplifier OP1 is electrically coupled to the signal output terminal Y of the subtractor 41. The first resistance unit R1 is electrically coupled between the first receiving terminal C and the inverted input terminal N of the operational amplifier OP1. The second resistance unit R2 is electrically coupled between the output terminal and the inverted input terminal N of the operational amplifier OP1. The third resistance unit R3 is electrically coupled between the second receiving terminal D and the non-inverted input terminal P of the operational amplifier OP1. The fourth resistance unit R4 is electrically coupled between the grounding terminal GND2 and the non-inverted input terminal P of the operational amplifier OP1.

More specifically, the signal source 1 outputs the unbalanced signals to the common mode noise cancellation circuit 4 via the first signal terminal S1 and the second signal terminal G1. The unbalanced signals are affected by the common mode noise Nc simultaneously. Impedance Z0 represents characteristic impedance of the signal line. The second signal terminal G1 is the grounding of the signal source 1. The second signal terminal G1 is coupled to the grounding terminal GND2 of common mode noise cancellation circuit 4 via an impedance unit Z1. Impedance of the impedance unit $Z1=R+jX$, wherein R represents real-part and X represents the imaginary part of the impedance unit Z1. When R is almost zero, DC potential of the second signal terminal G1 is almost equaled to that of the grounding terminal GND2. Imaginary-part of the impedance of the impedance unit Z1 can separate alternating current (AC) signals such as noise, etc., between the second signal terminal G1 and the grounding terminal GND2.

The common mode noise cancellation circuit 4 of the present embodiment utilizes the analog subtractor 41, for signals from the first signal terminal S1 and the second signal terminal G1 on the respective first receiving terminal C and the second receiving terminal D can be subtracted from each other at the output terminal Y of the subtractor 41, so as to eliminate the common mode noise. Therefore, the common mode noise cancellation circuit 4 can be realized by utilizing, for instance, a subtractor comprising an operational amplifier. As shown in FIG. 3, the operational amplifier OP1 utilizes a positive voltage source VDD2. DC voltage output of the common mode noise cancellation circuit 4 can be adjusted according to resistances of a fourth resistance unit R4 and a resistor R5. By adjusting resistances of the first resistance unit R1, the second resistance unit R2, the third resistance unit R3, the fourth resistance unit R4 and the resistor R5 appropriately, an output voltage of $G*(S1-G1)$ can be obtained at the signal output terminal Y, where G represents a gain of the whole subtractor 41. The substractor 41 makes output of the operational amplifier OP1 be a ratio of the signal difference between the first signal terminal S1 (the first unbalanced input) and the second signal terminal G1 (the second unbalanced input). Therefore, the common mode noise can be eliminated by subtracting signals of the respective first signal terminal S1 and the second signal terminal G1 from each other.

The common mode noise cancellation circuit 4 described above can eliminate the common mode noise for the unbalanced signals, but requires a wiring, which is the impedance unit Z1 shown in FIG. 3, to connect the second signal terminal G1 and the grounding terminal GND2. In the present embodiment, the impedance unit Z1 is for separating or blocking the AC signal and for shorting the DC signal, so utilizing an inductor is an appropriate choice. However, reactance of the inductor (e.g. imaginary-part X of the impedance of the impedance unit Z1) is directly proportional to a frequency. The reactance of the inductor is generally lower when operating in a low frequency, so the ability to eliminate the low frequency noise is limited. The ability to eliminate the low frequency noise is improved if an inductor of higher reactance is utilized.

The subtractor 41 is not limited to the above embodiment, as long as the subtractor 41 is able to subtract signals on the first signal terminal S1 and the second signal terminal G1 from each other. For instance, the subtractor 41 can be realized by utilizing at least one inverter and an adder. When an inverter is coupled between the first receiving terminal C (or the second receiving terminal D) and one of the input terminals of the adder, an output of the adder is similar to the output of the subtractor 41 shown in FIG. 3.

[Another Embodiment of a Common Mode Noise Cancellation Circuit for an Unbalanced Signals]

Figure 4:
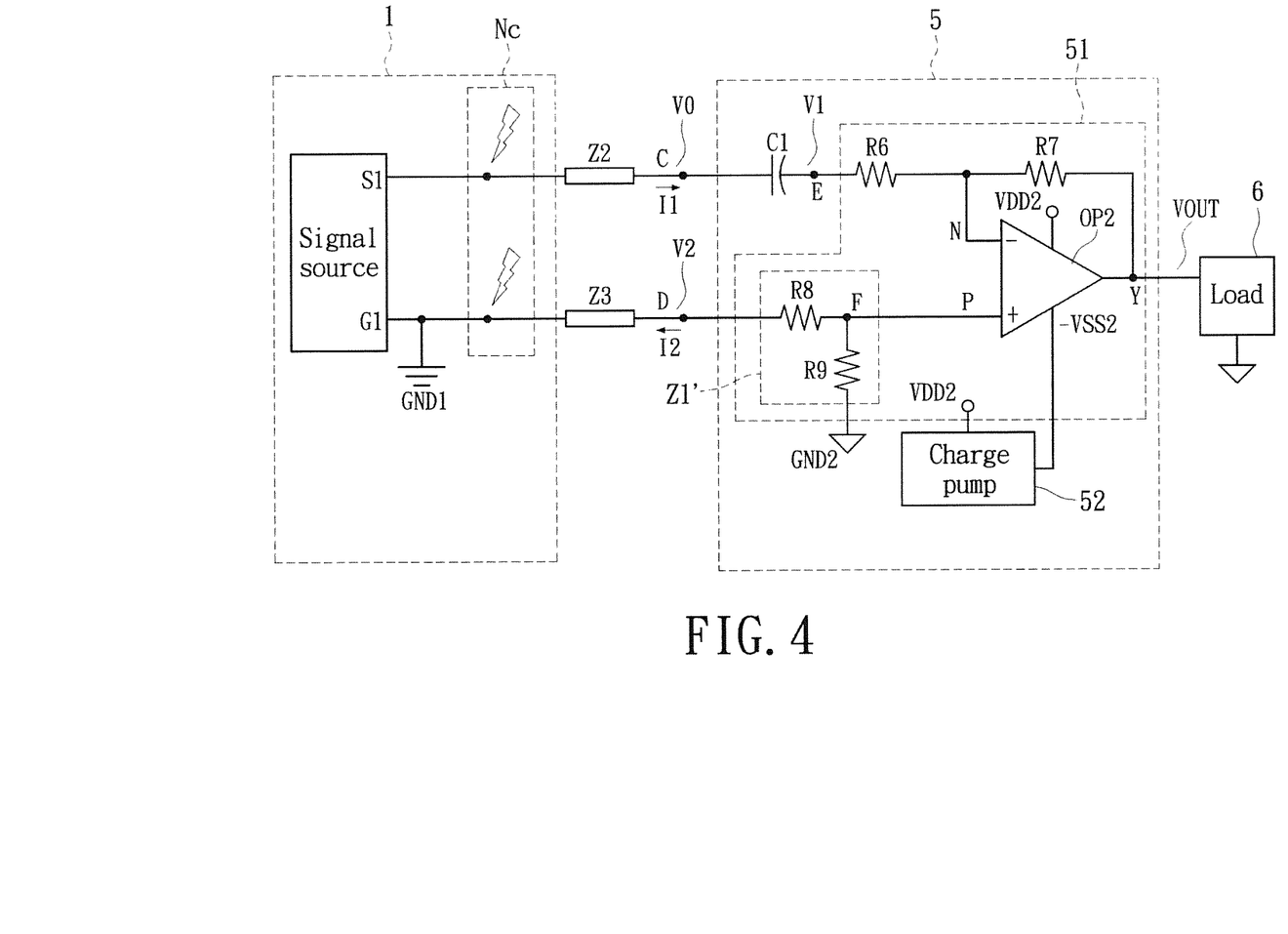
FIG. 4 is a diagram of a common mode noise cancellation circuit for the unbalanced signals according to another embodiment of the present disclosure.

Please refer to FIG. 4. FIG. 4 is a diagram of a common mode noise cancellation circuit 5 for the unbalanced signals according to another embodiment of the present disclosure. The signal source 1 generates the unbalanced signals through a first signal terminal S1 and a second signal terminal G1. The second signal terminal G1 is coupled to a grounding terminal GND1 and possesses a first grounding potential. The unbalanced signals can be any signals that are single-ended and referenced to a ground. The common mode noise cancellation circuit 5 comprises a grounding terminal GND2, a subtractor 51 and a charge pump 52.

A grounding terminal GND2 possesses a second grounding potential and is electrically coupled to the second signal terminal G1 of the signal source 1 via an impedance unit Z1'. In the present embodiment, the impedance unit Z1' is composed of a third resistance unit R8 and a fourth resistance unit R9, which are specified in more details later. The subtractor 51 comprises a first receiving terminal C (or referred as node C), a second receiving terminal D (or referred as node D) and a signal output terminal Y. The first receiving terminal C and the second receiving terminal D are electrically coupled to the first signal terminal S1 and the second signal terminal G1 respectively, for receiving the unbalanced signals. An input of the subtractor 51 is from noise of the first receiving terminal C and the second receiving terminal D. The subtractor 51 outputs at a node Y. Such structure of the subtractor 51 can reduce, or eliminate, noise at the signal output terminal Y. The signal output terminal Y is electrically coupled to a load 6. The charge pump 52 which transfers the positive supply voltage to negative supply voltage provides negative supply voltage –VSS2 as the ground voltage of operational amplifier OP2.

In the present embodiment, the subtractor 51 comprises an operational amplifier OP2, a first resistance unit R6, a second resistance unit R7, a third resistance unit R8 and a fourth resistance unit R9. The operational amplifier OP2 comprises an inverted input terminal N, a non-inverted input terminal P and an output terminal, where the output terminal is electrically coupled to the signal output terminal Y of the subtractor 51. The first resistance unit R6 is electrically coupled between the first receiving terminal C and the inverted input terminal N of the operational amplifier OP2. The second resistance unit R7 is electrically coupled between the output terminal and the inverted input terminal N of the operational amplifier OP2. The third resistance unit R8 is electrically coupled between the second receiving terminal D and the non-inverted input terminal P of the operational amplifier OP2. The fourth resistance unit R9 is electrically coupled between the grounding terminal GND2 and the non-inverted input terminal P of the operational amplifier OP2. The capacitor C1 is coupled between the first receiving terminal C of the subtractor 51 and the first resistance unit R6 of the subtractor 51 (i.e. between the node C and the node E).

Figure 5:
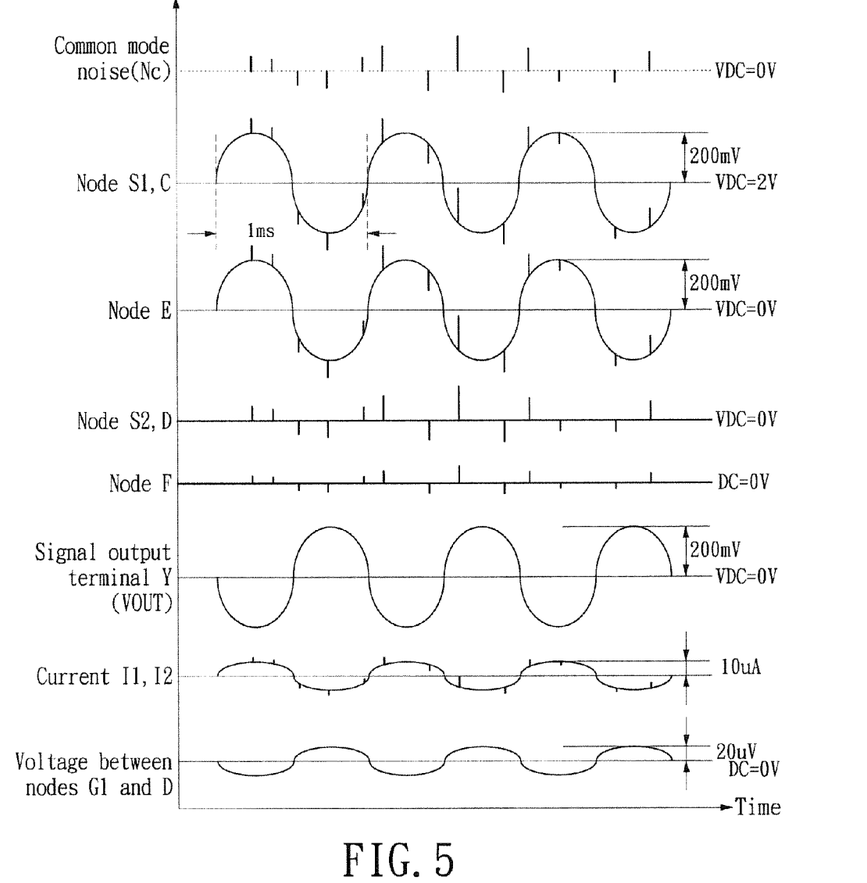
FIG. 5 is a diagram illustrating a waveform of the common mode noise cancellation circuit shown in FIG. 4.

A structural difference between the common mode noise cancellation circuit 5 shown in FIG. 5 and the common mode noise cancellation circuit 4 shown in FIG. 4 is that the common mode noise cancellation circuit 5 does not require to go through the a third grounding wiring (e.g. wiring representing the impedance unit Z1 shown in FIG. 3). The first signal terminal S1 and the second signal terminal G1 of the signal source 1 are affected by the common mode noise Nc. Impedance Z2 represents characteristic impedance between the first signal terminal S1 and the first receiving terminal C. Impedance Z3 represents characteristic impedance between the second signal terminal G1 and the second receiving terminal D. In the common mode noise cancellation circuit 5, the charge pump 52 can convert an input voltage of the voltage source VDD2 into another negative voltage source –VSS2. With the negative supply voltage of the charge pump 52, the OP2 is able to extend its input and output DC operation voltage nearly from +VDD2 to –VSS2. Therefore, any grounding signal is within the normal operation range of the operational amplifier OP2.

Assuming a capacitance of the capacitor C1 and resistances of the first resistance unit R6 and the second resistance unit R7 are all very large, then a voltage V0 of the first receiving terminal C is different from a DC voltage portion of a voltage V1 of the node E, and an AC voltage and phase of the voltage V1 is almost equal to an AC voltage and phase of the voltage V0. VOUT is a voltage of the signal output terminal Y of the common mode noise cancellation circuit 5. By utilizing a subtractor comprising the operational amplifier OP2, the first resistance unit R6, the second resistance unit R7, the third resistance unit R8 and the fourth resistance unit R9, a converting formula of such circuit can be derived as below:

$$VOUT = \left(\frac{R9}{R8+R9}\right)\left(\frac{R6+R7}{R6}\right)V2 - \left(\frac{R7}{R6}\right)V1$$

From the above formula, it can be observed that voltages of the nodes D and E are V2 and V1 respectively. The common mode signals of the voltage V1 and the voltage V2 can be roughly canceled from each other at the output if these two terms (R9/(R8+R9))*((R6+R7)/R6) and (R7/R6) are approximately in the ratio of 1. More specifically, for completely cancelling out the common mode signals of the voltage V1 and the voltage V2, a critical condition for completely cancelling out the common mode signals at the output end is shown as the formula below:

$$\left(\frac{R9}{R8+R9}\right)\left(\frac{R6+R7}{R6}\right)=\left(\frac{R7}{R6}\right)$$

One simple solution is R6=R7 and R8=R9 for a voltage gain of the common mode noise cancellation circuit 5 to be −1. In other words, when a resistance of the first resistance unit R6 equals to a resistance of the second resistance unit R7, and when a resistance of the third resistance unit R8 equals to a resistance of the fourth resistance unit R9, a voltage gain of the common mode noise cancellation circuit 5 is −1.

Further, a current I1 flowing into the node C equals to a current I2 flowing out from the node D, so a potential difference Vd=−I1*(R8−R9) exists between the grounding terminal GND2 and the grounding terminal GND1. In order to reduce the voltage difference Vd between the grounding terminal GND2 and the grounding terminal GND1, the current I1 should be decreased, or the resistances of the third resistance unit R8 and the fourth resistance unit R9 should be decreased. For instance, resistances of the third resistance unit R8 and the fourth resistance unit R9 can be configured to be both very smaller than resistances of the first resistance unit R6 and the second resistance unit R7. If the unit R6 and the unit R7 are very large, the current flow I1 into node C will be very small, and leads to equal very small current flow I2 out from the node D. Also if the unit R8 and the unit R9 are very small, then the voltage difference of GND1 and GND2 will be relatively small. As a result, we may keep such voltage difference between two grounding signals to the minimum or almost set to be near zero by suitable arrangements of all the above resistances in the common mode noise rejection system. For instance, the resistance of the third resistance unit R8 or the fourth resistance unit R9 can be configured to be lot smaller than the resistance of the first resistance unit R6 or the second resistance unit R7 (e.g. the resistance of the third resistance unit R8 or the fourth resistance unit R9 is configured to be smaller than one thousandth of the resistance of the first resistance unit R6 or the second resistance unit R7). However, the present disclosure does not therefore limit resistances of the first resistance unit R6, the second resistance unit R7, the third resistance unit R8 and the fourth resistance unit R9. According to the above design principle, grounding potentials of the respective signal source 1 and the common mode noise cancellation circuit 5 can be kept to be very similar to each other, and common mode noise of the voltage VOUT at the signal output terminal Y of the common mode noise cancellation circuit 5 can be accordingly eliminated. In the present embodiment, the resistance of the fourth resistance unit R9 is smaller than 100 ohms and the DC voltage of the signal output terminal Y of the subtractor 51 is close to zero potential.

The subtractor 51 is not limited to descriptions of the previous embodiments, as long as the subtractor 51 can subtract signals of the first receiving terminal C and the second receiving terminal D from each other and then output the subtracted signal. For instance, the subtractor can also be realized by utilizing at least one inverter and an adder.

Please refer to FIG. 4 and FIG. 5. FIG. 5 is a diagram illustrating a waveform of the common mode noise cancellation circuit shown in FIG. 4. A design embodiment is exemplified below: the DC voltage potential of the first signal terminal S1 is 2V and carries a sinusoidal signal with amplitude of 200 mV and a frequency of 1 kHz. The first signal terminal S1 (or referred to as the node S1) and the second signal terminal G1 (or referred to as the node G1) are both affected by the common mode noise Nc. Assuming Z2=Z3=0, C1=100 uF, R6=R7=20 kΩ and R8=R6=1Ω, the operational amplifier OP2 utilizes power from a positive voltage source of 3.3V and a negative voltage source of −2.5V generated by the charge pump 52. Also, assuming gain and driving capability of the operational amplifier OP2 are infinitely large, the output voltage of the operational amplifier OP2 is between positive and negative 2.0V, and the grounding terminal GND2 is of a zero potential which is referenced by the common mode noise cancellation circuit 5. Accordingly, waveform of each node is shown in FIG. 5. In the present embodiment, signals with common noise eliminated can be obtained at the signal output terminal Y, and the DC potential of the grounding terminal GND1 is equaled to that of the grounding terminal GND2. Voltage amplitude of the AC portion between the first signal terminal S1 and the second receiving terminal D is 20 uV (after the common mode noise Nc is deducted).

In summary, the common mode noise cancellation circuit of the present disclosure for the unbalanced signals can eliminate the common mode noise from the signal source via signal subtraction, when the unbalanced signals are received or transmitted. The common mode noise cancellation circuit of the embodiments of the present disclosure can eliminate noise of all frequency bands, and can easily eliminate the common mode noise of the low frequency band, for increasing tolerance to the common mode noise. Further, the impedance unit coupled between the grounding terminal of the common mode noise cancellation circuit and the grounding terminal (e.g. the second signal terminal) of the signal source can possess very small resistance, for potential of the grounding terminal of the common mode noise cancellation circuit to almost equal the potential of the grounding terminal of the signal source, The above-mentioned descriptions represent merely the exemplary embodiment of the present disclosure, without any intention to limit the scope of the present disclosure thereto. Various equivalent changes, alternations or modifications based on the claims of present disclosure are all consequently viewed as being embraced by the scope of the present disclosure.

What is claimed is:

1. A common mode noise cancellation circuit for the unbalanced signals, the unbalanced signals coming from a first signal terminal and a second signal terminal of a signal source, the second signal terminal having a first grounding potential, the common mode noise cancellation circuit comprising:
    a grounding terminal, having a second grounding potential, the grounding terminal is electrically coupled to the second signal terminal of the signal source via an impedance unit; and
    a subtractor, comprising a first receiving terminal, a second receiving terminal and a signal output terminal, the first receiving terminal and the second receiving terminal are electrically coupled to the first signal terminal and the second signal terminal respectively, for receiving the unbalanced signals, the subtractor subtracting noise coming from the first signal terminal and noise coming from the second signal terminal from each other for reducing noise outputted by the signal output terminal.

2. The common mode noise cancellation circuit for the unbalanced signals according to claim 1, wherein the subtractor comprises:
    an operational amplifier, comprising an inverted input terminal, a non-inverted input terminal and an output terminal, the output terminal electrically coupled to the signal output terminal of the subtractor;

a first resistance unit, electrically coupled between the first receiving terminal and the inverted input terminal of the operational amplifier;

a second resistance unit, electrically coupled between the output terminal and the inverted input terminal of the operational amplifier;

a third resistance unit, electrically coupled between the second receiving terminal and the non-inverted input terminal of the operational amplifier; and a fourth resistance unit, electrically coupled between the grounding terminal and the non-inverted input terminal of the operational amplifier.

3. The common mode noise cancellation circuit for the unbalanced signals according to claim 2, wherein the impedance unit is an inductor.

4. The common mode noise cancellation circuit for the unbalanced signals according to claim 2, wherein the impedance unit is composed of the third resistance unit and the fourth resistance unit.

5. The common mode noise cancellation circuit for the unbalanced signals according to claim 2, wherein resistance of the first resistance unit equals to resistance of the second resistance unit, and resistance of the third resistance unit equals resistance of the fourth resistance unit.

6. The common mode noise cancellation circuit for the unbalanced signals according to claim 5, wherein the resistance of the third resistance unit and the resistance of the fourth resistance unit are smaller than the resistance of the first resistance unit and the resistance of the second resistance unit.

7. The common mode noise cancellation circuit for the unbalanced signals according to claim 6, wherein the resistance of the third resistance unit or the resistance of the fourth resistance unit is a lot smaller than the resistance of the first resistance unit or the resistance of the second resistance unit.

8. The common mode noise cancellation circuit for the unbalanced signals according to claim 2, further comprising a charge pump, electrically coupled to a positive voltage source and providing a negative voltage source to the subtractor according to the positive voltage source, wherein the operational amplifier further comprises a negative power receiving terminal, the negative power receiving terminal is electrically coupled to the negative voltage source generated by the charge pump, amplitudes of an input voltage and an output voltage of the operational amplifier are across a positive voltage and a negative voltage, wherein resistance of the fourth resistance unit is smaller than 100 ohms, and a direct current voltage of the signal output terminal of the subtractor is close to, or equal to, zero potential.

9. The common mode noise cancellation circuit for the unbalanced signals according to claim 1, wherein the unbalanced signals are audio signals.

10. The common mode noise cancellation circuit for the unbalanced signals according to claim 1, further comprising a charge pump, wherein the charge pump is electrically coupled to a positive voltage source and provides a negative voltage source to the subtractor according to the positive voltage source.

11. A common mode noise cancellation circuit for the unbalanced signals receiving a first unbalanced input, a second unbalanced input and having a signal output terminal, comprising:

an operational amplifier operating in positive and negative voltage, comprising an inverted input terminal, a non-inverted input terminal and an output terminal, the output terminal electrically coupled to the signal output terminal of the cancellation circuit;

a first resistance unit, electrically coupled between the first unbalanced input and the inverted input terminal of the operational amplifier;

a second resistance unit, electrically coupled between the output terminal and the inverted input terminal of the operational amplifier;

a third resistance unit, electrically coupled between the second unbalanced input and the non-inverted input terminal of the operational amplifier;

a fourth resistance unit, electrically coupled between the grounding terminal and the non-inverted input terminal of the operational amplifier; and a charge pump circuit, generating a negative supply voltage as the negative voltage source of the operational amplifier.

12. The common mode noise cancellation circuit for the unbalanced signals according to claim 11, wherein the second unbalanced input is the grounding signal with the voltage around zero.

13. The common mode noise cancellation circuit for the unbalanced signals according to claim 11, wherein the first resistance, the second resistance, the third resistance, the fourth resistance and the operational amplifier forms a substractor, the substractor makes output of the operational amplifier be a ratio of the signal difference between the first unbalanced input and the second unbalanced input.

14. The common mode noise cancellation circuit for the unbalanced signals according to claim 11, wherein the first resistance, the second resistance, the third resistance and the forth resistance are suitable selected that makes voltage difference between the second unbalanced input and the ground of the cancellation circuit be close to zero.

* * * * *